(12) United States Patent
Lin et al.

(10) Patent No.: US 10,123,408 B2
(45) Date of Patent: Nov. 6, 2018

(54) CIRCUIT BOARD, CURRENT-MEASURING DEVICE, AND METHOD OF MEASURING A CURRENT OF A CIRCUIT BOARD

(75) Inventors: Chih-Jung Lin, New Taipei (TW); Yueh-Lin Liao, Taipei (TW)

(73) Assignee: Nvidia Corporation, Santa Clara, CA (US)

( * ) Notice: Subject to any disclaimer, the term of this patent is extended or adjusted under 35 U.S.C. 154(b) by 934 days.

(21) Appl. No.: 13/420,413

(22) Filed: Mar. 14, 2012

(65) Prior Publication Data

US 2013/0241533 A1   Sep. 19, 2013

(51) Int. Cl.
| | |
|---|---|
| *G01R 15/18* | (2006.01) |
| *G01R 15/20* | (2006.01) |
| *G01R 19/00* | (2006.01) |
| *G01R 33/02* | (2006.01) |
| *G01R 33/07* | (2006.01) |
| *G01R 31/26* | (2014.01) |
| *G01R 31/28* | (2006.01) |
| *H01F 5/00* | (2006.01) |
| *H05K 1/02* | (2006.01) |

(52) U.S. Cl.
CPC ......... *H05K 1/0268* (2013.01); *G01R 15/207* (2013.01); *G01R 19/0092* (2013.01); *H05K 2201/09063* (2013.01); *H05K 2201/09072* (2013.01)

(58) Field of Classification Search
CPC .. G01R 15/202; G01R 15/207; G01R 15/181; G01R 15/20; G01R 33/0029; G01R 33/0076; G01R 33/07; G01R 15/18; G01R 19/00; G01R 33/00; G01R 33/02; G01R 31/26; G01R 31/28; H01F 5/00
USPC .................................. 324/117 H, 117 R, 243
See application file for complete search history.

(56) References Cited

U.S. PATENT DOCUMENTS

| | | | | |
|---|---|---|---|---|
| 4,893,073 | A * | 1/1990 | McDonald et al. ...... | 324/117 H |
| 5,416,407 | A * | 5/1995 | Drafts ........................ | 324/117 H |
| 5,489,851 | A * | 2/1996 | Heumann et al. ........... | 324/537 |
| 6,362,964 | B1 * | 3/2002 | Dubhashi ................ | H01L 23/24 |
| | | | | 361/707 |
| 7,250,749 | B2 * | 7/2007 | Itoh ........................... | 324/117 H |
| 7,352,270 | B1 * | 4/2008 | Copeland ............ | H01F 17/0033 |
| | | | | 336/200 |
| 7,661,996 | B2 * | 2/2010 | Takahashi et al. ........... | 439/744 |
| 7,855,546 | B2 * | 12/2010 | Aratani ..................... | 324/117 H |
| 2006/0033487 | A1 * | 2/2006 | Nagano et al. ........... | 324/117 H |
| 2009/0009280 | A1 * | 1/2009 | Ishihara ....................... | 336/234 |
| 2012/0086451 | A1 * | 4/2012 | Eberler et al. ................ | 324/318 |
| 2013/0082695 | A1 * | 4/2013 | Johnson ........................ | 324/243 |

\* cited by examiner

*Primary Examiner* — Neel Shah

(57) ABSTRACT

A circuit board includes a substrate and a conductive trace. An electronic element is electrically coupled with the conductive trace. A pair of holes pass through the substrate and are disposed respectively at two opposite sides of the conductive trace and adjacent to the conductive trace. A current-measuring device may be adapted for passing through the holes and surrounding the conductive trace.

14 Claims, 6 Drawing Sheets

CIRCUIT BOARD, CURRENT-MEASURING DEVICE, AND METHOD OF MEASURING A CURRENT OF A CIRCUIT BOARD

FIELD OF THE INVENTION

Embodiments of the present invention relate to an electronic device, a measuring device and a method of measuring a current of the electronic device, and more particularly, to a circuit board, a current-measuring device and a method of measuring a current of the circuit board.

BACKGROUND OF THE INVENTION

FIGS. 1A-1B are schematic views of a conventional method of measuring a current of a choke on a circuit board. Referring to FIG. 1A, the circuit board 100 which will be measured comprises a board body 110 and a choke 120. The board body 110 comprises at least one circuit layer 112 having at least one conductive trace 112a (two conductive traces 112a are shown in FIG. 1A). Each of the conductive traces 112a comprises at least one pad 112b. The choke 120 comprises a plurality of leads 122. The choke 120 is disposed on the board body 110 and electrically connected to the pads 112b of the conductive traces 112a through the leads 122.

Referring to FIGS. 1A and 1B, when the current of the choke 120 is to be measured, the leads 122 of the choke 120 must be de-soldered from the pad 112b of one of the conductive traces 112a. Then, a wire 10 may be used to electrically connect the de-soldered lead 122 of the choke 120 and the de-soldered pad 112b of the conductive trace 112a. Next, a current probe 20, such as Tektronik TCP305 current probe, may be used to encircle the wire 10 such that the current passing the wire 10 can be measured. After measurement of the current, the de-soldered lead 122 of the choke 120 may be electrically connected to the de-soldered pad 112b again by means of soldering.

However, in the conventional art, during the process of measuring the current of the choke 120, one of the leads 122 of the choke 120 must be de-soldered from the pad 112b of one of the conductive traces 112a, and therefore, the circuit board 100 may be damaged. Further, for some cases, this task cannot be achieved due to mechanical limitations.

BRIEF SUMMARY OF THE INVENTION

Embodiments of the present invention provide a circuit board having a pair of through holes.

Embodiments of the present invention provide a current-measuring device adapted for passing through the through holes.

Embodiments of the present invention provide a method of measuring a current of the circuit board having the pair of through holes.

One embodiment of the present invention provides a circuit board adapted for being measured by a current-measuring device. The circuit board comprises a board body, an electronic element and a pair of through holes. The board body comprises at least one conductive trace. The electronic element is disposed on the board body and electrically coupled with the conductive trace. The through holes pass through the board body and are disposed respectively at two opposite sides of the conductive trace and adjacent to the conductive trace. The current-measuring device is adapted for passing through the through holes and surrounding the conductive trace.

In one embodiment of the present invention, the electronic element is a choke.

In one embodiment of the present invention, the circuit board is a motherboard, a VGA card, or other printed circuit board.

In one embodiment of the present invention, the current-measuring device comprises an annular magnetic permeable core and a sensor. When the current-measuring device is set at the circuit board, the sensor is disposed at the annular magnetic permeable core and the annular magnetic permeable core passes through the through holes and surrounds the conductive trace.

In one embodiment of the present invention, the material of the annular magnetic permeable core comprises ferrite.

In one embodiment of the present invention, the sensor is a Hall sensor.

In one embodiment of the present invention, the annular magnetic permeable core comprises a first core body and a second core body. When the current-measuring device is set at the circuit board, part of the first core body and part of the second core body are disposed respectively at two sides of the board body, the sensor is disposed at the first core body, and two ends of the first core body are coupled with two ends of the second core body, respectively.

In one embodiment of the present invention, the annular magnetic permeable core comprises a first core body and a second core body. When the current-measuring device is set at the circuit board, part of the first core body and part of the second core body are disposed respectively at two sides of the board body, the sensor is disposed between one end of the first core body and one end of the second core body, and another end of the first core body are coupled with another end of the second core body.

Another aspect of the present invention is to provide the current-measuring device adapted for measuring a current of the circuit board. The current-measuring device is adapted for passing through the through holes and surrounding the conductive trace.

Another aspect of the present invention is to provide a method of measuring a current of the circuit board. The method comprises the following steps. First, the circuit board is provided. Thereafter, the current-measuring device is set at the circuit board such that the current-measuring device passes through the through holes and surrounds the conductive trace.

The circuit board of one embodiment of the present invention includes the through holes disposed respectively at two sides of the conductive trace and adjacent to the conductive trace, and therefore, comparing to the conventional art, during the process of measuring the output current of the electronic element passing through the conductive trace of the circuit board, it may be unnecessary to de-solder the electronic element from the conductive trace. Accordingly, the circuit board of embodiments of the present invention can be prevented from being damaged during the measuring process such that the electrical characteristics of the circuit board of embodiments of the present invention can be maintained. Further, embodiments of the present invention allow for measuring of electrical characteristics when such a task would conventionally be unachievable due to mechanical limitations.

The aforesaid features and advantages of embodiments of the present invention are further illustrated with the following description and the appended claims or embodiments described hereunder.

DETAILED DESCRIPTION OF THE INVENTION

Figure 1A:
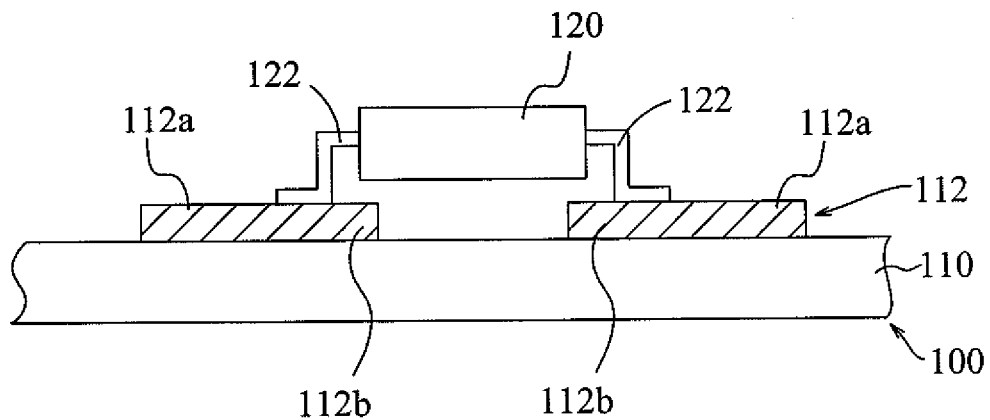
FIGS. 1A-1B are schematic views of a conventional method of measuring a current of a choke on a circuit board.
Figure 1B:
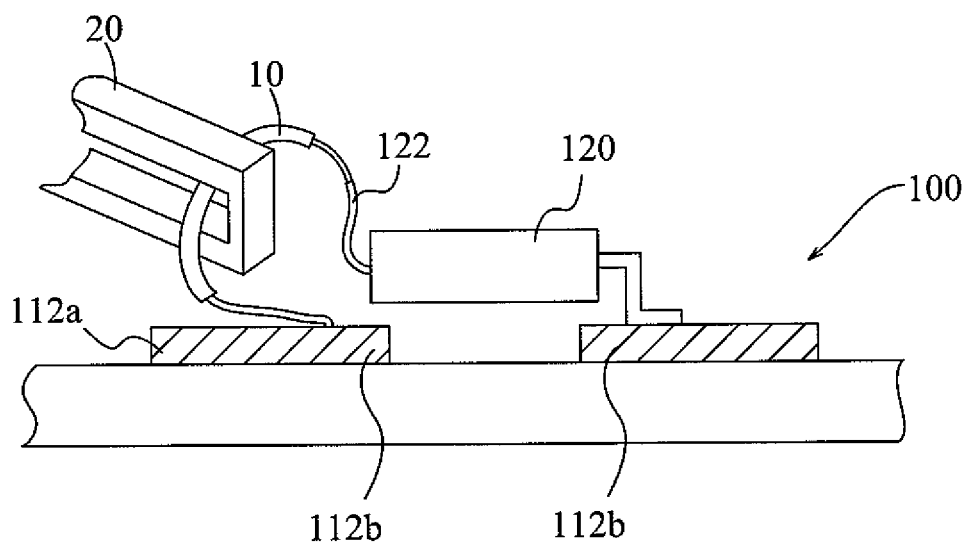

The preferred embodiments of the present invention will now be described in greater detail by referring to the drawings that accompany the present application. It should be noted that the features illustrated in the drawings are not necessarily drawn to scale. Descriptions of well-known components, materials, and process techniques are omitted so as to not unnecessarily obscure embodiments of the invention. Any devices, components, materials, and steps described in embodiments are only for illustration and not intended to limit the scope of the present invention.

Figure 2A:
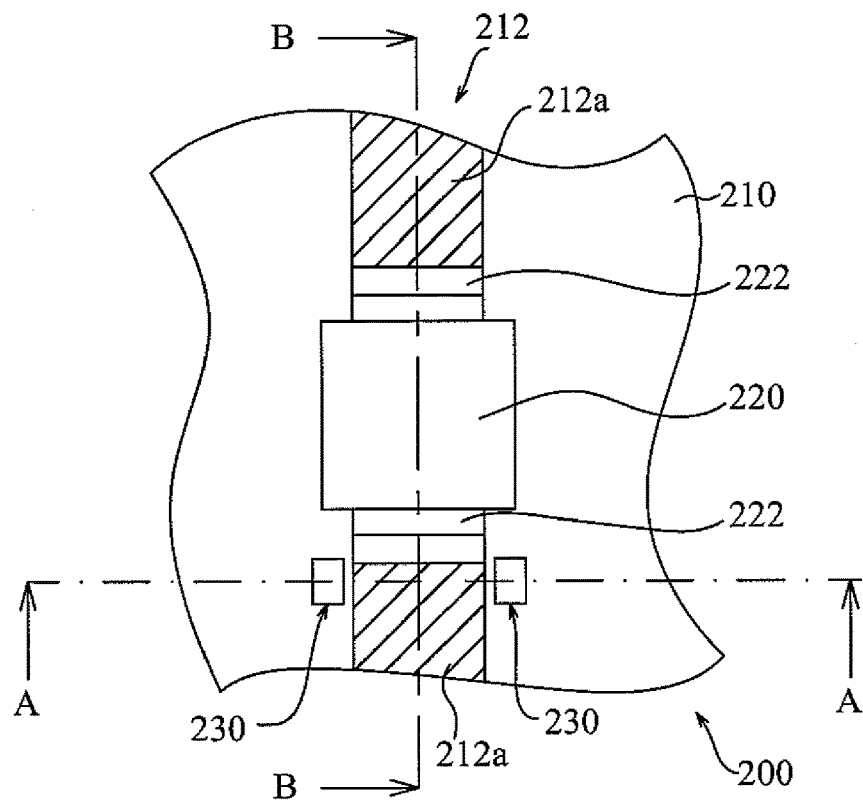
FIG. 2A is a schematic top view of a circuit board of an embodiment of the present invention.
Figure 2B:
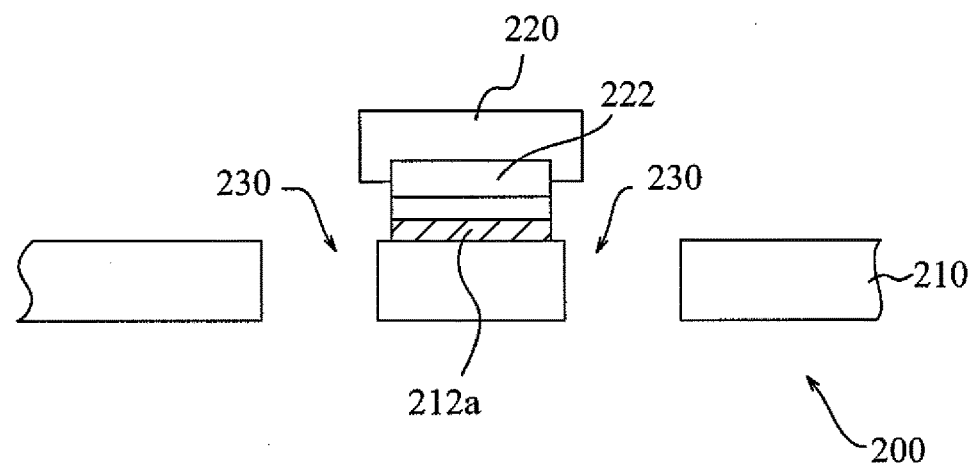
FIG. 2B is a schematic cross-sectional view of the circuit board along a line A-A of FIG. 2A.
Figure 2C:
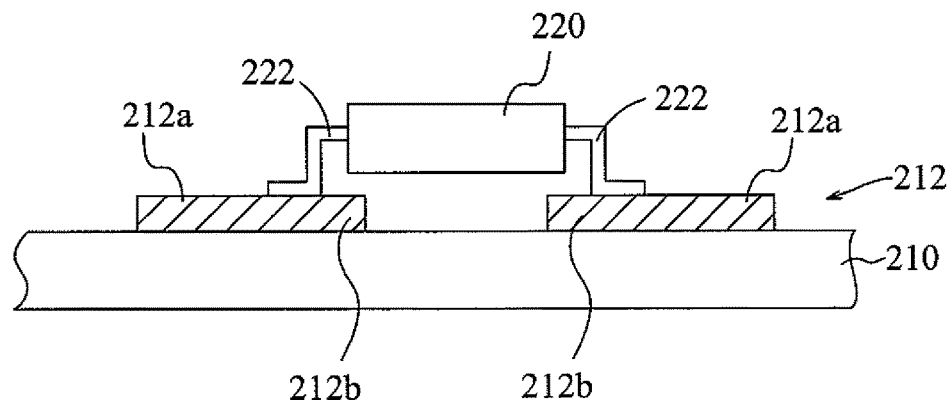
FIG. 2C is a schematic cross-sectional view of the circuit board along a line B-B of FIG. 2A.

FIG. 2A is a schematic top view of a circuit board of an embodiment of the present invention. FIG. 2B is a schematic cross-sectional view of the circuit board along a line A-A of FIG. 2A. FIG. 2C is a schematic cross-sectional view of the circuit board along a line B-B of FIG. 2A. Referring to FIGS. 2A, 2B and 2C, the circuit board 200 is, for example, a motherboard, a VGA card, or a graphics subsystem card (see FIG. 6) and comprises a substrate or board body 210, an electronic element 220 and a pair of through holes 230. The board body 210 comprises at least one circuit layer 212 and only one circuit layer 212 is schematically shown in each of FIGS. 2A-2C. The circuit layer 212 comprises at least one conductive trace 212a and two conductive traces 212a are schematically shown in each of FIGS. 2A and 2C. Each of the conductive traces 212a comprises at least one pad 212b. The electronic element 220 is, for example, a choke and disposed on the board body 210 and electrically coupled with the conductive traces 212a. For example, the electronic element 220 comprises a plurality of leads 222 and the electronic element 220 is electrically coupled with the pads 212b of the conductive traces 212a through the leads 222. The through holes 230 pass through the board body 210 and are disposed respectively at two opposite sides of one of the conductive traces 212a and adjacent to the corresponding trace 212a.

Figure 3:
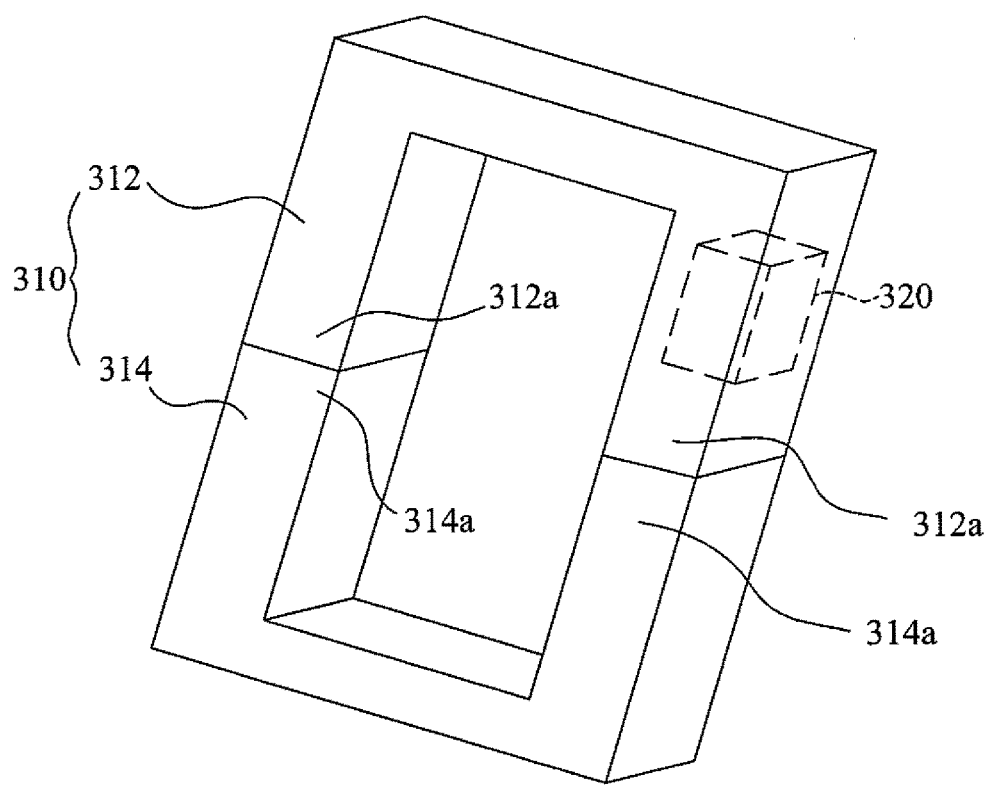
FIG. 3 is a schematic view of a current-measuring device of an embodiment of the present invention.

FIG. 3 is a schematic view of a current-measuring device of an embodiment of the present invention. Referring to FIG. 3, the current-measuring device 300 comprises an annular magnetic permeable core 310 and a sensor 320 disposed at the annular magnetic permeable core 310. The shape of the cross section of the annular magnetic permeable core 310 can be rectangular or circular. The material of the annular magnetic permeable core 310 may comprise ferrite. The annular magnetic permeable core 310 comprises a first core body 312 and a second core body 314. Two ends 312a of the first core body 312 are adapted for being coupled with two ends 314a of the second core body 314, respectively. The sensor 320 may be, for example, a Hall sensor and disposed at the first core body 312 of the annular magnetic permeable core 310. In addition, transmission lines or pins of the sensor 320 can extend outside but not shown in FIG. 3.

Figure 4A:
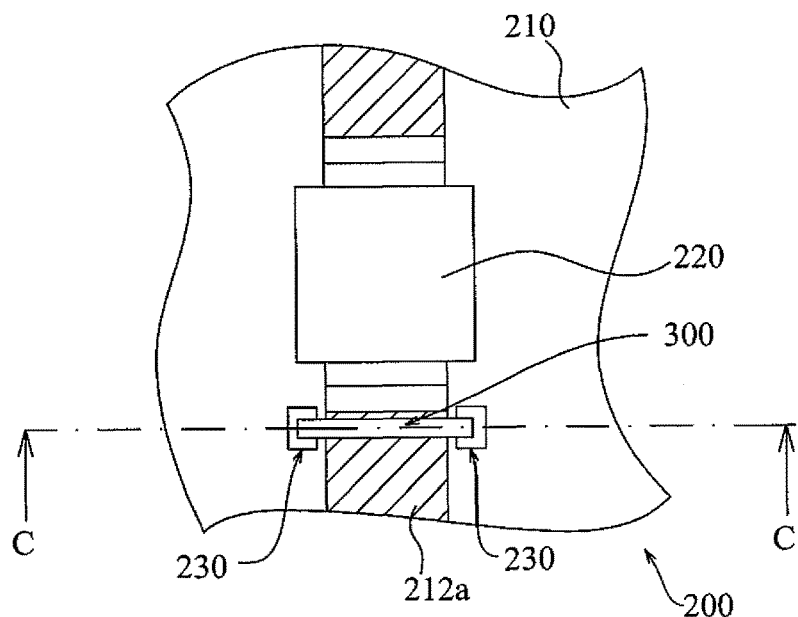
FIG. 4A is a schematic top view of the current-measuring device measuring the current passing through one of the conductive traces of the circuit board of FIG. 2A.
Figure 4B:
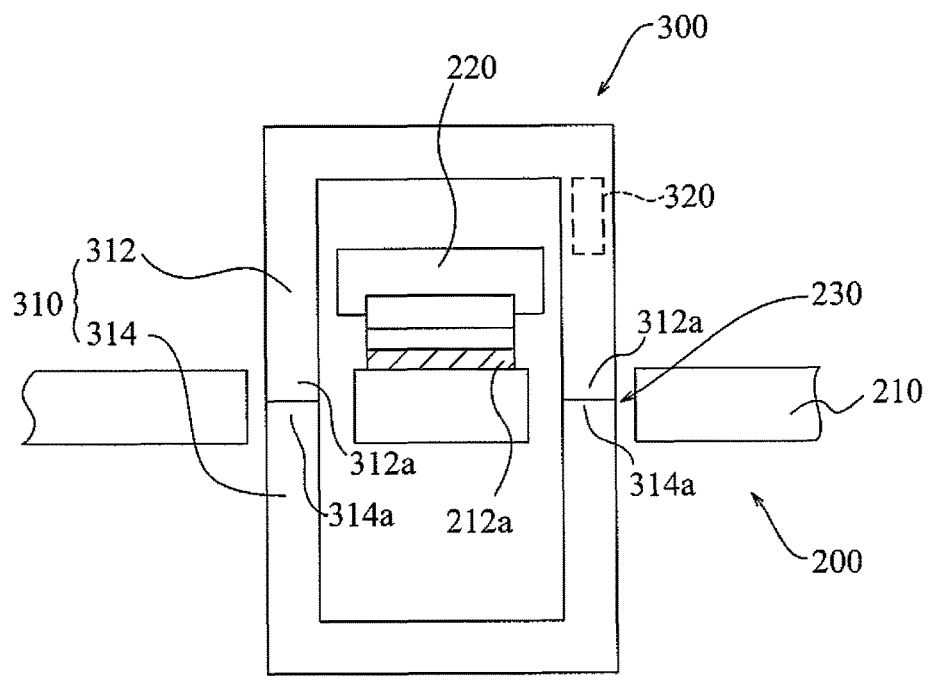
FIG. 4B is a schematic cross-sectional view of the current-measuring device along a line C-C of FIG. 4A.

FIG. 4A is a schematic top view of the current-measuring device measuring the current passing through one of the conductive traces of the circuit board of FIG. 2A. FIG. 4B is a schematic cross-sectional view of the current-measuring device along a line C-C of FIG. 4A. Referring to FIGS. 4A and 4B, when the circuit board 200 and the current-measuring device 300 are provided, the current-measuring device 300 may be used to measure the current of the circuit board 200. The current-measuring device 300 may be set at the circuit board 200 such that the current-measuring device 300 passes through the through holes 230 and surrounds the corresponding conductive trace 212a. In one embodiment, the annular magnetic permeable core 310 passes through the through holes 230 and surrounds the corresponding conductive trace 212a. Specifically, in an embodiment, part of the first core body 312 and part of the second core body 314 of the annular magnetic permeable core 310 are disposed respectively at two sides of the board body 210 of the circuit board 200. The two ends 312a of the first core body 312 are coupled with two ends 314a of the second core body 314, respectively.

Accordingly, when an output current of the electronic element 220 passes through the conductive trace 212a that the annular magnetic permeable core 310 surrounds, the sensor 320 can sense and measure the output current of the electronic element 220.

Figure 5:
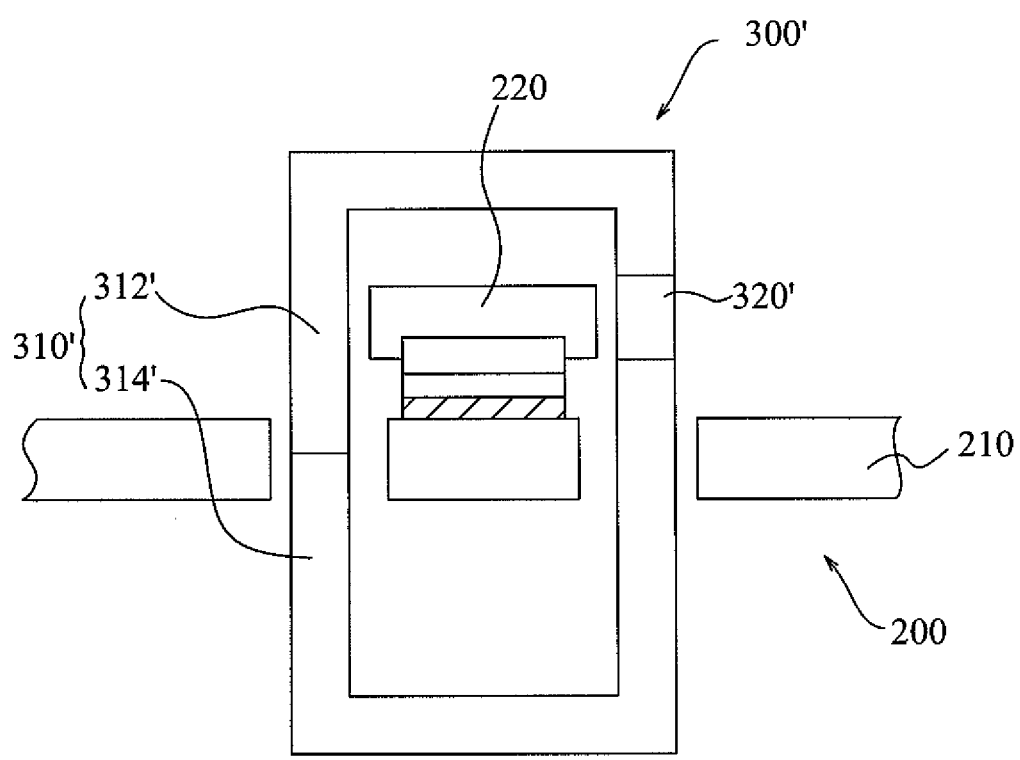
FIG. 5 is a schematic cross-sectional view of the current-measuring device measuring the conductive trace of the circuit board according to another embodiment of the invention.

FIG. 5 is a schematic cross-sectional view of a current-measuring device measuring the conductive trace of the circuit board according to another embodiment of the invention. In an embodiment, when a current-measuring device 300' comprising an annular magnetic permeable core 310' and a sensor 320' is set at the circuit board 200, part of a first core body 312' and part of a second core body 314' of the annular magnetic permeable core 310' may be disposed respectively at two sides of the board body 210 of the circuit board 200, the sensor 320' is disposed between one end of the first core body 312' and one end of the second core body 314', and another end of the first core body 312' are coupled with another end of the second core body 314'.

The circuit board and the method of measuring the current of the circuit board according to one embodiment of the present invention include the following or other advantages. The circuit board of an embodiment of the present invention has through holes disposed respectively at two sides of a conductive trace and adjacent to a conductive trace, and therefore, comparing to the conventional art, during a process of measuring the output current of an electronic element passing through the conductive trace of a circuit board, the electronic element is unnecessary to be de-soldered from the conductive trace. Accordingly, the circuit board of an embodiment of the present invention can be prevented from being damaged during the measuring process such that the electrical characteristics of the circuit board of embodiments of the present invention can be maintained.

Figure 6:
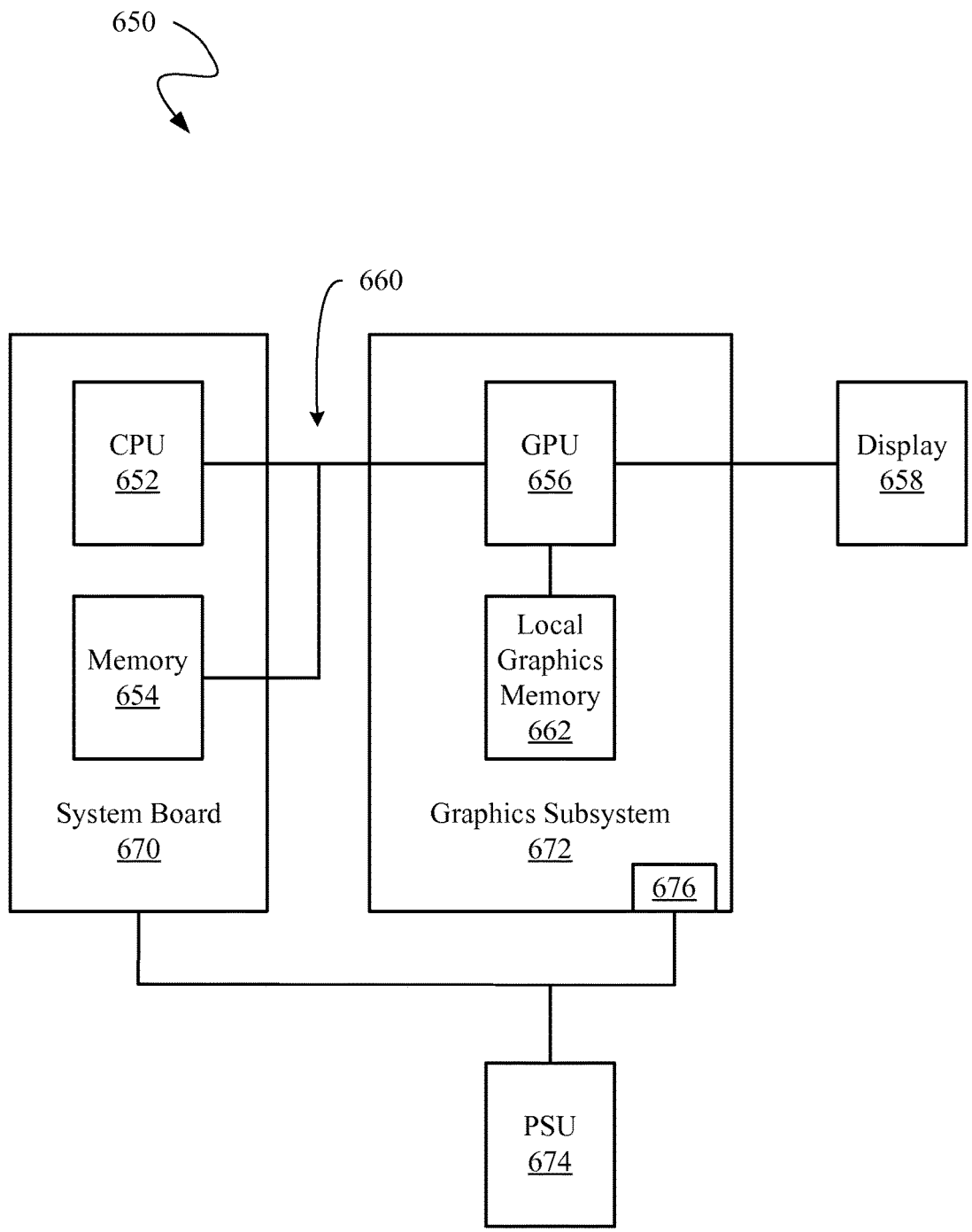
FIG. 6 shows an exemplary computer system, components of which may be on a circuit board measured in embodiments of the present invention, in accordance with one embodiment of the present invention.

FIG. 6 shows an exemplary computer system 650, components of which may be on a circuit board measured in embodiments of the present invention, in accordance with one embodiment of the present invention. Computer system 650 depicts the components in accordance with embodiments of the present invention providing the execution platform for certain hardware-based and software-based functionality. In general, computer system 650 comprises a system board 670 including at least one central processing unit (CPU) 652 and a system memory 654. The CPU 652 can be coupled to the system memory 654 via a bridge component/memory controller (not shown) or can be directly coupled to the system memory 654 via a memory controller (not shown) internal to the CPU 652.

Computer system 650 also comprises a graphics subsystem 672 including at least one graphics processor unit (GPU) 656. For example, the graphics subsystem 672 may be included on a graphics card. The graphics subsystem 672 may be coupled to a display 658. One or more additional GPUs can optionally be coupled to system 650 to further increase its computational power. The GPU(s) 656 may be coupled to the CPU 652 and the system memory 654 via a communication bus 660. The GPU 656 can be implemented as a discrete component, a discrete graphics card designed to couple to the computer system 650 via a connector (e.g., AGP slot, PCI-Express slot, etc.), a discrete integrated circuit die (e.g., mounted directly on a motherboard), or as an integrated GPU included within the integrated circuit die of a computer system chipset component (not shown). Additionally, a local graphics memory 662 may be coupled with the GPU 656 for high bandwidth graphics data storage, e.g., the frame buffer.

A power source unit (PSU) 674 may provide electrical power to the system board 670 and graphics subsystem 672. The PSU 674 may couple with the graphics subsystem 672 through power cables and/or power connectors that connect with a power connector 676 in the graphics subsystem 672. For example, the power connector 676 may be a connector on the edge of a graphics card that is operable to couple with power cables extending from the PSU 674.

The CPU 652 and the GPU 656 can also be integrated into a single integrated circuit die and the CPU and GPU may share various resources, such as instruction logic, buffers, functional units and so on, or separate resources may be provided for graphics and general-purpose operations. The GPU may further be integrated into a core logic component. Accordingly, any or all the circuits and/or functionality described herein as being associated with the GPU 656 can also be implemented in, and performed by, a suitably equipped CPU 652. Additionally, while embodiments herein may make reference to a GPU, it should be noted that the described circuits and/or functionality can also be implemented and other types of processors (e.g., general purpose or other special-purpose coprocessors) or within a CPU.

System 650 can be implemented as, for example, a desktop computer system or server computer system having a powerful general-purpose CPU 652 coupled to a dedicated graphics rendering GPU 656. In such an embodiment, components can be included that add peripheral buses, specialized audio/video components, IO devices, and the like. Similarly, system 650 can be implemented as a portable device (e.g., cellphone, PDA, etc.), direct broadcast satellite (DBS)/terrestrial set-top box or a set-top video game console device such as, for example, the Xbox®, available from Microsoft Corporation of Redmond, Wash., or the PlayStation3®, available from Sony Computer Entertainment Corporation of Tokyo, Japan. System 650 can also be implemented as a "system on a chip", where the electronics (e.g., the components 652, 654, 656, 662, and the like) of a computing device are wholly contained within a single integrated circuit die. Examples include a hand-held instrument with a display, a car navigation system, a portable entertainment system, and the like.

The foregoing preferred embodiments are provided to illustrate and disclose the technical features of the present invention, and are not intended to be restrictive of the scope of the present invention. Hence, all equivalent variations or modifications made to the foregoing embodiments without departing from the spirit embodied in the disclosure of the present invention should fall within the scope of the present invention as set forth in the appended claims.

What is claimed is:

1. A circuit board, comprising:
   a substrate;
   a conductive trace;
   an electronic element electrically coupled with the conductive trace; and
   a pair of holes passing through the substrate and disposed respectively at two opposite sides of the conductive trace and adjacent to the conductive trace, wherein a current-measuring device is adapted for passing through the holes and surrounding the conductive trace, and wherein further each of the pair of holes is disposed in a distance from any edge of the circuit board, wherein the current-measuring device comprises an annular magnetic permeable core and a sensor, wherein the sensor is disposed inside the annular magnetic permeable core; and wherein the annular magnetic permeable core passes through the holes and surrounds the conductive trace and forms a close-ended loop.

2. The circuit board of claim 1, wherein the electronic element is a choke.

3. The circuit board of claim 1, wherein the circuit board is a motherboard or a graphics subsystem card.

4. The circuit board of claim 1, wherein the annular magnetic permeable core comprises ferrite.

5. The circuit board of claim 1, wherein the sensor is a Hall sensor.

6. The circuit board of claim 1, wherein:
   the annular magnetic permeable core comprises a first core body and a second core body;
   a first portion of the first core body and a first portion of the second core body are disposed respectively at opposite surface sides of the circuit board;
   the sensor is disposed in the first core body; and
   two ends of the first core body are coupled with two ends of the second core body, respectively, to form the close-ended loop.

7. A current-measuring device, adapted for measuring a current of a circuit board, the current-measuring device comprising:
   a conductive trace; and
   a pair of holes passing through the circuit board and disposed respectively at two opposite sides of the conductive trace and adjacent to the conductive trace, wherein a sensing device is adapted for passing through the pair of holes and surrounding the conductive trace, wherein the sensing device comprises an annular magnetic permeable core adapted for passing through the pair of holes and surrounding the conductive trace, and wherein further the annular magnetic permeable core forms a closed-ended loop, wherein further each of the pair of holes is disposed in a distance from any edge of the circuit board, and wherein the sensing device further comprises a sensor disposed in the annular magnetic permeable core.

8. The current-measuring device of claim 7, wherein the annular magnetic permeable core comprises ferrite.

9. The current-measuring device of claim 7, wherein the sensor is a Hall sensor.

10. The current-measuring device of claim 7, wherein:
   the annular magnetic permeable core comprises a first core body and a second core body;
   a first portion of the first core body and a first portion of the second core body are disposed respectively at two surface sides of the circuit board; and
   two ends of the first core body are coupled with two ends of the second core body, respectively.

11. A method of measuring a current of a circuit board, the method comprising:
   setting a current-measuring device in a current-measuring position relative to the circuit board, wherein the circuit board comprises:
   a conductive trace;
   an electronic element electrically coupled with the conductive trace;
   a pair of holes passing through the circuit board and disposed respectively at two opposite sides of the conductive trace and adjacent to the conductive trace, wherein each of the pair of holes is disposed in a distance from any edge of the circuit board; and
   wherein the current-measuring position comprises the current-measuring device passing through the pair of holes and surrounding the conductive trace; and
   recording a measurement from the current-measuring device
   wherein:
   the current-measuring device comprises an annular magnetic permeable core and a sensor, further wherein the sensor is disposed in the annular magnetic permeable core;
   the annular magnetic permeable core passes through the pair of holes and surrounds the conductive trace; and
   the annular magnetic permeable core forms a close-ended loop.

12. The method of measuring a current of a circuit board of claim 11, wherein the annular magnetic permeable core comprises ferrite.

13. The method of measuring a current of a circuit board of claim 11, wherein the sensor is a Hall sensor.

14. The method of measuring a current of a circuit board of claim 11, wherein:
   the annular magnetic permeable core comprises a first core body and a second core body;
   a first portion of the first core body and a first portion of the second core body are disposed respectively at two sides of the circuit board;
   the sensor is disposed in the first core body; and
   two ends of the first core body are coupled with two ends of the second core body, respectively.

* * * * *